US011751368B2

(12) United States Patent
Miyanaga et al.

(10) Patent No.: US 11,751,368 B2
(45) Date of Patent: Sep. 5, 2023

(54) ELECTRICALLY CONDUCTIVE RESIN COMPOSITION AND ELECTROMAGNETIC SHIELDING MATERIAL THEREWITH

(71) Applicants: Nippon Steel Chemical & Material Co., Ltd., Tokyo (JP); Mazda Motor Corporation, Hiroshima (JP)

(72) Inventors: Toshiaki Miyanaga, Chiyoda-ku Tokyo (JP); Kazuhisa To, Hiroshima (JP); Nobuyoshi Kajioka, Hiroshima (JP); Junichi Ogawa, Hiroshima (JP); Kenji Hiramoto, Hiroshima (JP)

(73) Assignees: NIPPON STEEL CHEMICAL & MATERIAL CO., LTD., Tokyo (JP); MAZDA MOTOR CORPORATION, Hiroshima (JP)

( * ) Notice: Subject to any disclaimer, the term of this patent is extended or adjusted under 35 U.S.C. 154(b) by 89 days.

(21) Appl. No.: 17/183,379

(22) Filed: Feb. 24, 2021

(65) Prior Publication Data
US 2021/0307217 A1 Sep. 30, 2021

(30) Foreign Application Priority Data
Mar. 31, 2020 (JP) ................................. 2020-062856

(51) Int. Cl.
*C08K 3/04* (2006.01)
*H05K 9/00* (2006.01)
*C08K 7/06* (2006.01)
*C08K 13/04* (2006.01)

(52) U.S. Cl.
CPC .............. *H05K 9/009* (2013.01); *C08K 3/04* (2013.01); *C08K 7/06* (2013.01); *C08K 13/04* (2013.01); *C08K 2201/001* (2013.01); *C08K 2201/003* (2013.01); *C08K 2201/004* (2013.01); *C08K 2201/005* (2013.01); *C08K 2201/014* (2013.01); *C08K 2201/016* (2013.01)

(58) Field of Classification Search
CPC . H05K 9/009; C08K 3/04; C08K 3/40; C08K 7/02; C08K 7/06; C08K 7/14; C08K 13/04; C08K 2201/001; C08K 2201/003; C08K 2201/004; C08K 2201/005; C08K 2201/014; C08K 2201/016
See application file for complete search history.

(56) References Cited

U.S. PATENT DOCUMENTS

| 6,811,917 B2* | 11/2004 | Fitts ...................... H01B 1/24 252/502 |
| 7,674,402 B2* | 3/2010 | Iino ................... H01M 8/0226 524/495 |
| 7,728,066 B2* | 6/2010 | Egami ................ H01M 8/0226 524/847 |
| 10,494,508 B2* | 12/2019 | Christ .................... C04B 35/532 |
| 2008/0280202 A1* | 11/2008 | Yen ..................... H01M 8/0213 252/502 |
| 2017/0365372 A1* | 12/2017 | Kaneko ................ C08L 101/00 |
| 2019/0309204 A1* | 10/2019 | Takagi .................... C08K 3/04 |
| 2019/0322836 A1* | 10/2019 | Gilles ..................... C08K 3/04 |

FOREIGN PATENT DOCUMENTS

| JP | 6-251620 A | 9/1994 |
| JP | H09-129029 A | 5/1997 |
| JP | 2008-239947 A | 10/2008 |
| JP | 2012-158648 A | 8/2012 |
| JP | 2018104543 A | * 7/2018 ............ C08L 101/00 |

OTHER PUBLICATIONS

Machine translation of JP 2018104543 A to Yoshioka, published Jul. 5, 2018 (Year: 2018).*
King et al. "Thermal and electrical conductivity of carbon-filled liquid crystal polymer composites", Journal of Applied Polymer Science, vol. 99, 1552-1558, 2006. published Dec. 6, 2005 (Year: 2005).*

* cited by examiner

*Primary Examiner* — Jane L Stanley
(74) *Attorney, Agent, or Firm* — XSENSUS LLP

(57) ABSTRACT

The electrically conductive resin composition may contain matrix resin, coke powder, and carbon fiber. The volume mean particle diameter of the coke powder may be not less than 1 µm and not more than 500 µm. The content percentage of the coke powder in the electrically conductive resin composition may be not less than 1 wt % and not more than 60 wt %. The aspect ratio of the carbon fiber may be not less than 3 and not more than 1700. The content percentage of the carbon fiber in the electrically conductive resin composition may be not less than 0.5 wt % and not more than 10 wt %.

20 Claims, 8 Drawing Sheets

Coke21+CF2

Coke21+CF2+GF24

ELECTRICALLY CONDUCTIVE RESIN COMPOSITION AND ELECTROMAGNETIC SHIELDING MATERIAL THEREWITH

CROSS REFERENCE TO RELATED APPLICATION

The present application claims priority to Japanese patent application JP 2020-062856, filed Mar. 31, 2020, the entire contents of which being incorporated herein by reference in its entirety.

TECHNICAL FIELD

The present disclosure relates to an electrically conductive resin composition and an electromagnetic shielding material containing the electrically conductive resin composition.

BACKGROUND ART

In recent years, electrically conductive functions have been added to cover materials and the like used for automobile components, electronic devices, and the like and shield electromagnetic waves to prevent effects on human bodies, misoperations of electronic devices, and the like. Specifically, for example, cover materials used for the upper cover or the like of battery packs for electric vehicles are formed using metal plates or the like to shield electromagnetic waves emitted from the battery packs.

By the way, there is a demand for forming the cover material described above using resin to reduce the weight of an automobile, an electronic device, and the like.

Accordingly, various resin molded products with electromagnetic shielding performance have been considered. For example, patent document 1 discloses electrically conductive resin compositions in which coke powder and carbon-based electrically conductive scaly fillers (graphite) or metal-based electrically conductive scaly fillers are mixed with a thermosetting or thermoplastic resin material at a predetermined weight ratio.

PRIOR ART DOCUMENTS

Patent Documents

[Patent document 1] JP-A-6-251620

SUMMARY

Problems to be Solved

For example, in the field of automobiles, various technologies for sensing distance and speed or sensing obstacles using electromagnetic waves have been achieved. In such technologies, unnecessary electromagnetic waves need to be shielded with high precision for accurate sensing. In addition, it is important for such cover materials to have good mechanical properties such as high rigidity and to have good cost effectiveness.

Accordingly, an object of the present disclosure is to provide an electrically conductive resin composition that exhibits good electromagnetic shielding performance and good mechanical properties and achieves cost reduction, and an electromagnetic shielding material containing the electrically conductive resin composition.

Means for Solving the Problems

To solve the problem described above and other problems, the present disclosure forms a network of coke powder and carbon fiber in matrix resin by adding the coke powder and the carbon fiber to the matrix resin as electrically conductive materials.

In some embodiments, the electrically conductive resin composition disclosed herein contains matrix resin, coke powder, and carbon fiber. The volume mean particle diameter of the coke powder is not less than 1 μm and not more than 500 μm. The content percentage of the coke powder in the electrically conductive resin composition is not less than 1 wt % and no more than 60 wt %. The aspect ratio of the carbon fiber is not less than 3 and not more than 1700. The content percentage of the carbon fiber in the electrically conductive resin composition is not less than 0.5 wt % and not more than 10 wt %.

According to the structure described above, by adding the coke powder and the carbon fiber with an aspect ratio of not less than 3 and not more than 1700 as electrically conductive materials to the matrix resin, a network of the coke powder and the carbon fiber is formed in the matrix resin. This forms a path through which electricity flows in the matrix resin and causes a percolation phenomenon in which the electric conductivity rises dramatically. As a result, good electromagnetic shielding performance exhibits. In addition, since a network of the coke powder and the carbon fiber is formed in the matrix resin, good mechanical properties can be obtained when the electromagnetic shielding material is molded. In addition, since the amount of the coke powder and the carbon fiber is relatively small, the material cost is reduced.

In this specification, good electromagnetic shielding performance indicates that the shielding effect (SE) for electromagnetic waves with a frequency of 300 kHz to 3 MHz (more specifically, 1.7 MHz), which is used for, for example, ship communication, medium wave broadcasting (AM radio), beacons for ships and aircrafts, amateur radio, and the like, is 45 dB (shielding rate of 99%) or more. The measurement value of the electric field shielding effect is a value measured according to the KEC method (measurement method of the electromagnetic wave shielding effect developed by KEC Electronic Industry Development Center).

In an embodiment of the electrically conductive resin composition, the coke powder is pitch coke powder. This further improves the electric conductivity.

In an embodiment of the electrically conductive resin composition, the volume mean particle diameter of the coke powder is not less than 10 μm and not more than 50 μm. This further improves the electric conductivity and improves the mechanical properties of an electromagnetic shielding material.

In an embodiment of the electrically conductive resin composition, the mean fiber diameter of the carbon fiber is not less than 3 μm and not more than 12 μm, and the mean fiber length of the carbon fiber is not less than 0.5 mm and not more than 25 mm. In addition, in an embodiment of the electrically conductive resin composition, the mean fiber diameter of the carbon fiber is not less than 6 μm and not more than 10 μm, and the mean fiber length of the carbon fiber is not less than 3 mm and not more than 10 mm. According to the structure described above, the electric conductivity is further improved and the mechanical properties of the electromagnetic shielding material are improved.

In an embodiment of the electrically conductive resin composition, the total of the content percentage of the coke powder and the content percentage of the carbon fiber in the electrically conductive resin composition is not less than 5 wt % and not more than 70 wt %. In addition, in an embodiment of the electrically conductive resin composition, the total of the content percentage of the coke powder and the content percentage of the carbon fiber in the electrically conductive resin composition is not less than 5 wt % and not more than 40 wt %. According to the structure described above, the electric conductivity is further improved and the mechanical properties of the electromagnetic shielding material are improved.

In an embodiment of the electrically conductive resin composition, the electrically conductive resin composition further includes glass fiber, in which the content percentage of the glass fiber in the electrically conductive resin composition is not less than 10 wt % and not more than 40 wt %. In addition, in an embodiment of the electrically conductive resin composition, the total of the content percentage of the coke powder, the content percentage of the carbon fiber, and the content percentage of the glass fiber in the electrically conductive resin composition is not less than 15 wt % and not more than 70 wt %. According to the structure described above, the dispersibility of the coke powder and the carbon fiber in the matrix resin is improved and a network of the coke powder and the carbon fiber becomes denser. As a result, the path formed in the matrix resin through which electricity flows becomes long and thick, so the electric conductivity is further improved. In addition, the mechanical properties of the electromagnetic shielding material are further improved.

In an embodiment of the electrically conductive resin composition, the matrix resin is a thermoplastic resin. This can easily mold the electromagnetic shielding material.

The electromagnetic shielding material disclosed herein contains the electrically conductive resin composition described above. Accordingly, in the electromagnetic shielding material, good electromagnetic shielding performance, good mechanical properties, and cost reduction can be achieved.

Advantages

As described above, according to some embodiments of the present disclosure, it is possible to provide an electrically conductive resin composition that exhibits good electromagnetic shielding performance and good mechanical properties and achieves cost reduction, and an electromagnetic shielding material containing the electrically conductive resin composition.

BRIEF DESCRIPTION OF THE DRAWINGS

In FIG. 2, the long fiber specification indicates carbon fiber with a mean fiber length of 4 mm, a mean fiber diameter of 7 μm, and an aspect ratio of approximately 570. The short fiber specification represents a carbon fiber with a mean fiber length of 0.9 mm, a mean fiber diameter of 7 μm, and an aspect ratio of approximately 130. This is also true of FIG. 3, FIG. 4A, FIG. 4B, FIG. 5A, FIG. 5B, FIG. 6A, and FIG. 6B below.

In FIG. 4A, the long fiber specification represents the electrically conductive resin composition containing the carbon fiber of long fiber specification and the glass fiber of long fiber specification (with a mean fiber length of 2 mm, a mean fiber diameter of 18 μm, and an aspect ratio of approximately 110) described above. The short fiber specification represents the electrically conductive resin composition containing the carbon fiber of the short fiber specification and the glass fiber of the short fiber specification (with a mean fiber length of 1 mm, a mean fiber diameter of 18 μm, and an aspect ratio of approximately 56) described above. This is also true of FIG. 4B, FIG. 5A, FIG. 5B, FIG. 6A, and FIG. 6B below.

MODES FOR CARRYING OUT THE DISCLOSURE

Figure 1:
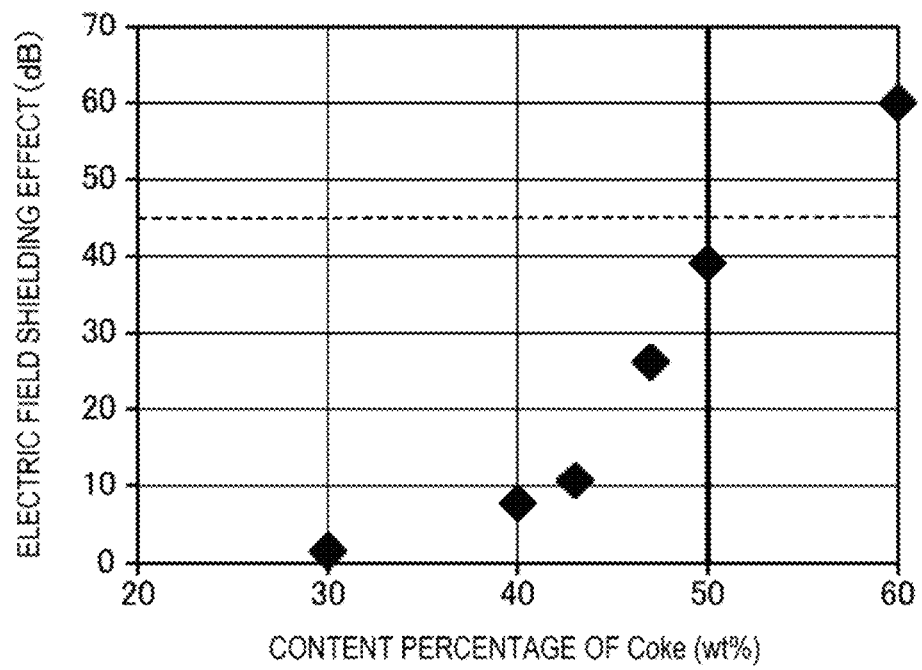
FIG. 1 illustrates the electromagnetic shielding performance of electrically conductive resin compositions containing coke powder (also referred to as "coke") alone.

An embodiment of the present disclosure will be described below with reference to the drawings. The description of the following preferred embodiment is only an example and is not intended to limit the present disclosure, the application thereof, and the use thereof.

<Electrically Conductive Resin Composition>

An electrically conductive resin composition according to the present embodiment contains matrix resin, coke powder, and carbon fiber. In other words, electrically conductive materials of two components are added to the matrix resin. This electrically conductive resin composition can be used as a material for molding an electromagnetic shielding material described later.

The matrix resin is a thermoplastic resin and/or a thermosetting resin. Examples of the thermoplastic resin include polystyrene, vinyl acetate, polyester, polyethylene, polypropylene, polyamide, rubber, and acrylic resins. Examples of the thermosetting resin include phenol, epoxy, urethane, melamine, and alkyd resins. These matrix resins may be used alone or two or more types may be used in combination. These matrix resins are preferably thermoplastic resins from the viewpoint of ease of moldability of the electromagnetic shielding material, and more preferably polypropylene (PP) from the viewpoint of cost and mechanical properties. A commercially available resin material can be used as the matrix resin.

The content percentage of the matrix resin in the electrically conductive resin composition is preferably 30 wt % or more and more preferably 40 wt % or more from the viewpoint of improving moldability. In addition, the content percentage of the matrix resin is preferably 90 wt % or less, more preferably 80 wt % or less, and still more preferably 70 wt % or less from the viewpoint of improving electric conductivity.

The coke powder indicates crushed particles of a carbon material (coke) obtained by dry distillation of coal or coking (thermal polymerization) of petroleum or coal-based heavy oil. This coke powder is a relatively inexpensive material as compared with carbon black and artificial graphite. In addition, the coke powder has almost the same electric conductivity as carbon black and carbon fiber.

Although commercially available coke powder can be used as the coke powder, pitch coke powder is preferable from the viewpoint of improving electric conductivity. This pitch coke powder is a graphitizable carbon material obtained by burning the soft pitch (SOP) separated from coal tar, which is a by-product of dry distillation (carbonization) of coal, at high temperature to remove the volatile matter content.

Of the pitch coke powder, the pitch coke powder having a plane spacing d002 (plane spacing of the "002 planes" measured by an X-ray diffractometer (XRD)) of 0.338 nm or more is preferable and the pitch coke powder having a plane spacing d002 in the range from 0.343 to 0.360 nm is more preferable.

Furthermore, the value of relative intensity ratio α (peak intensity (A)/peak intensity (B)) of the peak intensity (A) of the main crystal plane (that is, the "002 plane" detected in measurement by an X-ray diffraction measurement (XRD)) of the carbon constituting the pitch coke powder to the peak intensity (B) of the peak of the "100 plane" and the peak of the "004 plane", whichever is higher, is preferably not less than 2.5 and less than 27, more preferably not less than 16 and less than 26.5, and most preferably not less than 19 and less than 26.

It should be noted here that the plane spacing d002 of the "002 planes" of the coke powder and the relative intensity ratio α of the peak intensities can be measured by an X-ray diffractometer.

The plane spacing d002 was obtained using Bragg's equation $d=\lambda/\{2\times Sin(\theta/2)\}$ based on the diffraction angle θ of the maximum peak intensity close to 26° arising from the "002 plane". The wavelength 0.15405 nm of Kα1 of the used source Cu of X-ray diffraction was used as λ.

The relative intensity ratio α of the peak intensities was determined by the following procedure. The X-ray diffraction pattern of the coke powder at a diffraction angle of 10° to 90° was first measured, and the peak intensity (A) of the X-ray diffraction peak close to 26° arising from the "002 plane", the peak intensity of the X-ray diffraction peak close to 54° arising from the "100 plane", and the peak intensity of the X-ray diffraction peak close to 54° arising from the "004 plane" were calculated. Here, the peak intensity of the measurement plane having a higher peak among the "100 plane" and the "004 plane" was defined as the peak intensity (B). Next, the relative intensity ratio α (peak intensity (A)/peak intensity (B)) of the peak intensity (A) to the peak intensity (B) was calculated. At this time, in calculating the peak intensities, among the perpendicular lines drawn from the apexes of the peaks to the horizontal axis of the graph using the line connecting the inflection points on the left and right sides of the diffraction peak as the baseline, the diffraction intensity (cps) corresponding to the length from the intersections of the baseline and the perpendicular lines to the apexes was defined as the peak height (peak intensity).

Examples of the shape of the coke powder include spherical, elliptical, flake-like, fibrous, and dendritic shapes. The coke powder may be coke powder with a single shape or coke powder with different shapes may be used in combination.

The volume mean particle diameter (MV) of the coke powder is 1 μm or more and preferably 10 μm or more from the viewpoint of improving electric conductivity. The volume mean particle diameter of the coke powder is 500 μm or less and preferably 50 μm or less from the viewpoint of improving moldability. In the present specification, the volume mean particle diameter refers to a mean diameter weighted by the volume measured by a laser diffraction and scattering method.

The content percentage of the coke powder in the electrically conductive resin composition is 1 wt % or more, preferably 10 wt % or more, more preferably 20 wt % or more, still more preferably 25 wt % or more, and yet more preferably 30 wt % or more from the viewpoint of improving electric conductivity. Further, the content percentage of the coke powder is 60 wt % or less, preferably 50 wt % or less, and more preferably 40 wt % or less from the viewpoint of improving moldability.

As illustrated in FIG. 1 (see also Table 1), when the coke powder (volume mean particle diameter of 25 μm) is used alone as an electrically conductive material, to ensure sufficient electromagnetic shielding performance (for example, 45 dB or more), the coke powder with a content percentage of more than 60 wt % needs to be added to the matrix resin (PP in FIG. 1).

The reason is that the coke powder dispersed in the matrix resin exhibits electrically conductive functions by making mutual contact, as the content of the coke powder is larger, adjacent coke powders in the matrix resin are more likely to make mutual contact. As a result, the electric conductivity is considered to be improved. However, when the content of the coke powder is large, the flowability of the matrix resin degrades and the mold and the cylinder of the kneader become worn more. Accordingly, the moldability degrades and the mechanical properties of the electromagnetic shielding material to be obtained also degrade.

Accordingly, as a result of diligent studies on the above points, the inventors of the present application have found that a percolation phenomenon in which electric conductivity is dramatically increased occurs by combining the coke powder with a relatively small amount of carbon fiber.

As the carbon fiber, for example, commercially available carbon fiber such as polyacrylonitrile (PAN), pitch, cellulose, or hydrocarbon vapor-grown carbon fiber, or graphite fiber can be used. These types of carbon fiber may be used alone or two or more types may be used in combination.

The mean fiber length (weight mean fiber length) of the carbon fiber is preferably 0.5 mm or more, more preferably 1 mm or more, still more preferably 2 mm or more, yet more preferably 3 mm or more from the viewpoint of improving electric conductivity. The mean fiber length of the carbon fiber is preferably 25 mm or less and more preferably 10 mm or less from the viewpoint of improving moldability and mechanical properties. Of the carbon fiber, the carbon fiber of long fiber specification having a mean fiber length of 2 mm or more is preferable from the viewpoint of further improving electric conductivity.

It should be noted here that the mean fiber length in this specification refers to the mean value of the fiber lengths measured for 100 or more extracted fibers in a molded product. Examples of the method of extracting fibers include an ashing method and the like.

The mean fiber diameter of the carbon fiber is preferably 3 μm or more and more preferably 6 μm or more from the viewpoint of improving electric conductivity. The mean fiber diameter of the carbon fiber is preferably 12 μm or less and more preferably 10 μm or less from the viewpoint of improving moldability and mechanical properties.

In this specification, the mean fiber diameter refers to the mean diameter obtained by dividing the total value of the monofilament diameters of the monofilaments constituting a fiber bundle by the number of monofilaments constituting the fiber bundle for averaging. The monofilament diameter is the mean value of the maximum diameter and the minimum diameter of the cross-sections obtained when the monofilaments are cut in the direction orthogonal to the fiber axis direction. It should be noted here that the shape of the cross-section of the fiber is not particularly limited and may be a perfect circle or an ellipse. In addition, the outer circumference of the cross-section of the fiber may have a wavy shape with irregularities. The height of the irregularities only needs to be approximately 10% or less of the diameter of the monofilament.

The aspect ratio of the carbon fiber is 3 or more, preferably 70 or more, more preferably 100 or more, still more preferably 300 or more, yet more preferably 500 or more from the viewpoint of improving electric conductivity and mechanical properties. In addition, the aspect ratio of the carbon fiber is 1700 or less, preferably 1000 or less, and more preferably 600 or less from the viewpoint of improving moldability. In this specification, the aspect ratio refers to the ratio of the length of the fiber in the longitudinal direction (fiber axis direction) to the length in the lateral direction orthogonal to the longitudinal direction. In addition, the aspect ratio refers to the value measured by a laser diffraction scattering method.

The content percentage of the carbon fiber in the electrically conductive resin composition is 0.5 wt % or more, preferably 1 wt % or more, more preferably 1.5 wt % or more, and still more preferably 2 wt % or more from the viewpoint of improving electric conductivity. In addition, the content percentage of the carbon fiber is 10 wt % or less, preferably 7 wt % or less, and more preferably 5 wt % or less from the viewpoint of cost reduction of the electromagnetic shielding material.

Figure 2:
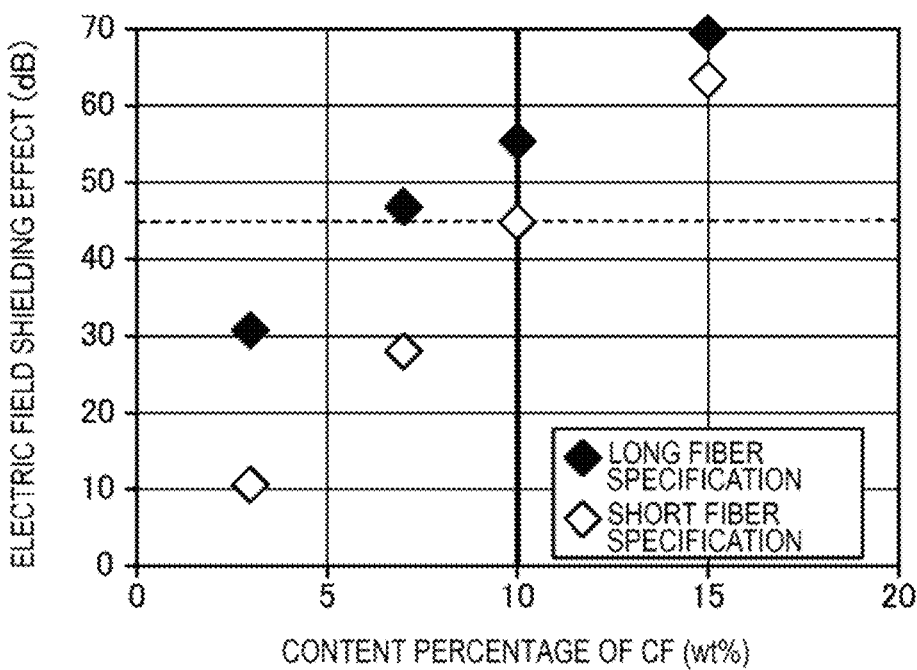
FIG. 2 illustrates the electromagnetic shielding performance of electrically conductive resin compositions containing carbon fiber (also referred to as "CF") alone.

As illustrated in FIG. 2 (see also Table 1), when the carbon fiber is used alone as an electrically conductive material, to ensure sufficient electromagnetic shielding performance (for example, 45 dB or more), the carbon fiber of long fiber specification with a content percentage of 7 wt % more needs to be added to the matrix resin (PP in FIG. 1). However, if the content of the carbon fiber is increased, the flowability of the matrix resin degrades and the cylinder and the metal die of the kneader wear more, resulting in reduction in the moldability and reduction in the mechanical properties of the electromagnetic shielding material to be obtained. In addition, the cost of the electromagnetic shielding material becomes high.

Figure 3:
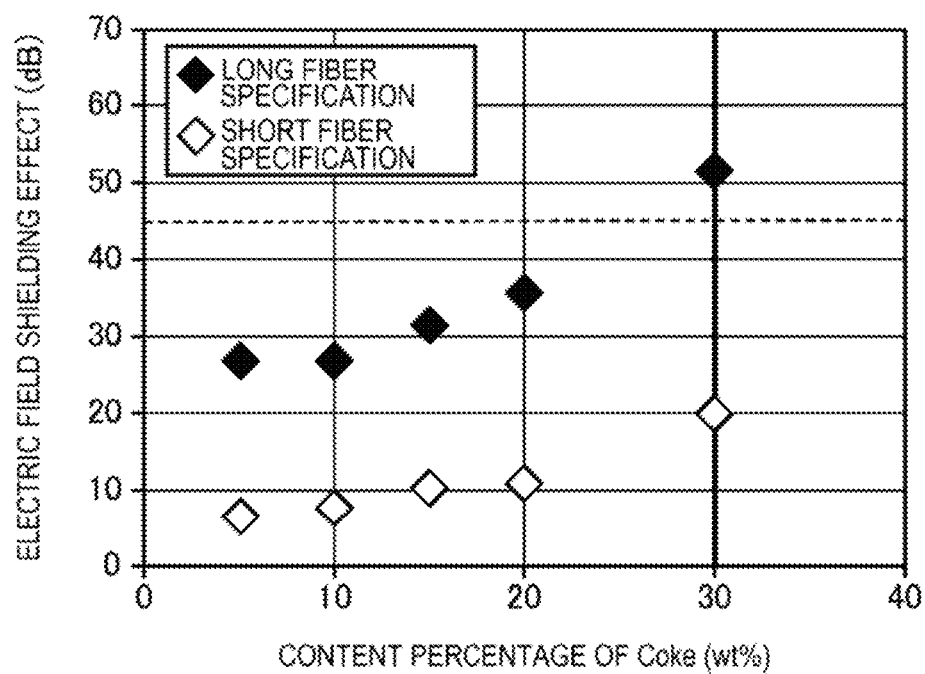
FIG. 3 illustrates the electromagnetic shielding performance of the electrically conductive resin composition containing the coke powder and the carbon fiber according to one embodiment of the present disclosure.

In contrast, as illustrated in FIG. 3 (see also Table 1), good electromagnetic shielding performance exhibits even if the content percentage of the carbon fiber is less than 7 wt % by combining, with a predetermined content percentage (30 wt % of the coke powder and 2 wt % of the carbon fiber in FIG. 3), the coke powder with a predetermined volume mean particle diameter (25 μm in FIG. 3) and the carbon fiber with a predetermined aspect ratio (570 in FIG. 3).

The reason may be that a network of the coke powder and the carbon fiber dispersed in the matrix resin is formed as described above. More specifically, when the carbon fiber makes contact with the coke powders separated from each other in the matrix resin, a path through which electricity flows is formed. As a result, a percolation phenomenon is considered to occur and dramatically increase the electric conductivity.

In addition, the total of the content percentage of the coke powder and the content percentage of the carbon fiber in the electrically conductive resin composition when the coke powder and the carbon fiber are used in combination as electrically conductive materials is less than the total of the content percentage of the coke powder and the content percentage of the carbon fiber in the electrically conductive resin composition when the coke powder and the carbon fiber are used alone. For example, to ensure an electromagnetic shielding performance of 45 dB or more, the content percentage of the coke powder when the coke powder is used alone is 60 wt % (see FIG. 1). The content percentage of the carbon fiber when the carbon fiber is used alone is 7 wt % (see FIG. 2). The total of the content percentage of the coke powder and the content percentage of the carbon fiber when the coke powder and the carbon fiber are used in combination is 32 wt % (see FIG. 3). That is, the total (32 wt %) of the content percentage of the coke powder and the content percentage of the carbon fiber in the electrically conductive resin composition when the coke powder and the carbon fiber are used in combination is reduced to the half or less of the total (67 wt %) of the content percentage of the coke powder and the content percentage of the carbon fiber in the electrically conductive resin composition when the coke powder and the carbon fiber are used alone. This can improve the mechanical properties of the electromagnetic shielding material and reduce the material cost of the electrically conductive material.

The total of the content percentage of the coke powder and the content percentage of the carbon fiber in the electrically conductive resin composition is preferably 5 wt % or more, more preferably 10 wt % or more, still more preferably 15 wt % or more, and yet more preferably 20 wt % from the viewpoint of improving electric conductivity. In addition, the total of the content percentage of the coke powder and the content percentage of the carbon fiber is preferably 70 wt % or less, more preferably 60 wt % or less, still more preferably 50 wt %, yet more preferably 40 wt %, and yet more preferably 35 wt % from the viewpoint of improving moldability and mechanical properties and reducing the cost of the electromagnetic shielding material.

It should be noted here that electrically conductive materials (any component) other than the coke powder and the carbon fiber may be added to the electrically conductive resin composition as long as the effect of the present disclosure is not impaired. Examples of other electric conductive materials include carbon black, metal fiber, metal filler (such as copper powder, silver powder, nickel powder, silver-coated copper powder, gold-coated copper powder, silver-coated nickel powder, or gold-coated nickel powder), metal-covered resin filler, and the like. The other electric conductive materials may be used alone or two or more types may be used in combination. Of the other electrically conductive materials, carbon black is preferable.

Examples of carbon black include acetylene black, gas black, oil black, naphthalene black, thermal black, furnace black, lamp black, channel black, roll black, disc black, and ketjen black depending on the raw material and the manufacturing method.

In addition, glass fiber may be added to the electrically conductive resin composition. Addition of the glass fiber further improves the mechanical properties and the electric conductivity of the electromagnetic shielding material.

Figure 4A:
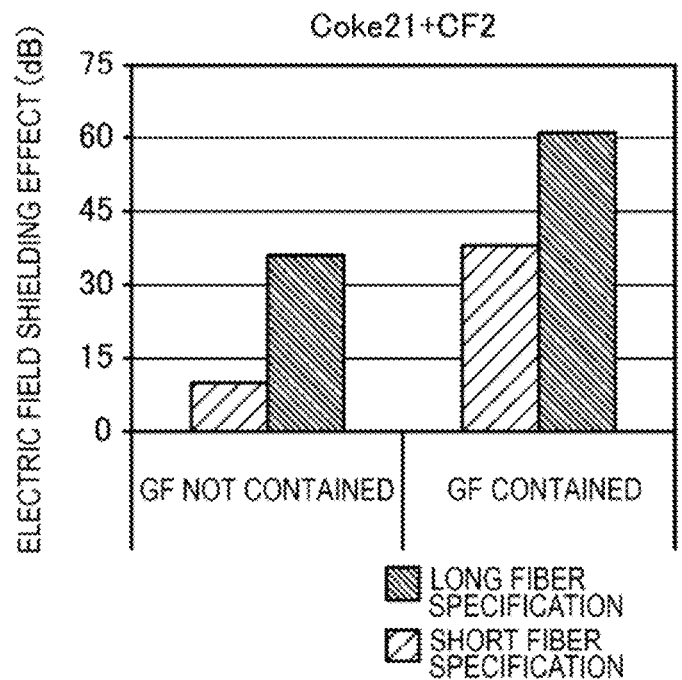
FIG. 4A illustrates the electromagnetic shielding performance of the electrically conductive resin composition containing 21 wt % of the coke powder and 2 wt % of the carbon fiber as electrically conductive materials, and the electromagnetic shielding performance of the electrically conductive materials in which the electrically conductive materials further contain 24 wt % of glass fiber (also referred to as "GF") according to one embodiment of the present disclosure.
Figure 4B:
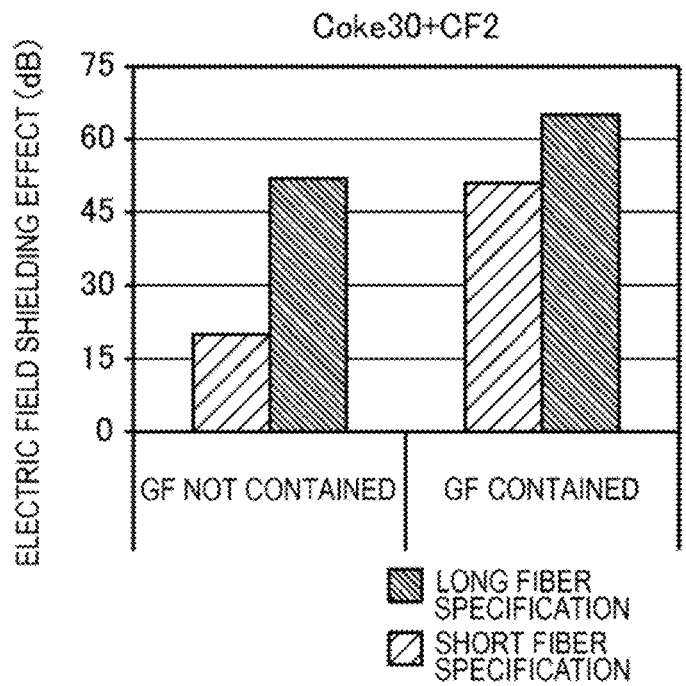
FIG. 4B illustrates the electromagnetic shielding performance of the electrically conductive resin composition containing 30 wt % of the coke powder and 2 wt % of the carbon fiber as electrically conductive materials, and the electromagnetic shielding performance of the electrically conductive material in which the electrically conductive materials further contain 18 wt % of the glass fiber according to one embodiment of the present disclosure.

As a result of diligent studies on the effect of adding glass fiber, the inventors of the present application have found that, as illustrated in FIG. 4A and FIG. 4B (see also Table 1), the electrically conductive resin composition in which glass fiber has been added to the matrix resin together with the coke powder and the carbon fiber improves not only the mechanical properties of the electromagnetic shielding material, but also the electric conductivity thereof as compared with the electrically conductive resin composition not containing the glass fiber. Accordingly, the electrically conductive resin composition preferably contains glass fiber. For example, "Coke21+CF2" (abbreviation of formulated components) in FIG. 4A represents the electrically conductive resin composition containing 21 wt % of the coke powder and 2 wt % of the carbon fiber (this is also true of the following).

Figure 5A:
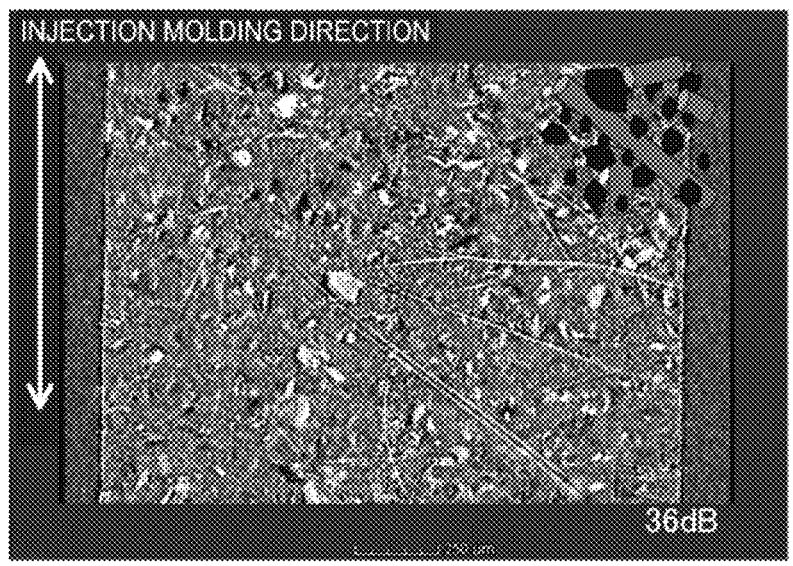
FIG. 5A illustrates an X-ray CT image of the plane along the injection molding direction and this CT image indicates the internal structure of the electrically conductive resin composition containing 21 wt % of the coke powder and 2 wt % of the carbon fiber of long fiber specification according to one embodiment of the present disclosure.
Figure 5B:
FIG. 5B illustrates an X-ray CT image of the plane along the injection molding direction and this CT image indicates the internal structure of the electrically conductive resin composition containing 21 wt % of the coke powder, 2 wt % of the carbon fiber of long fiber specification, and 24 wt % of the glass fiber of long fiber specification according to one embodiment of the present disclosure.
Figure 6A:
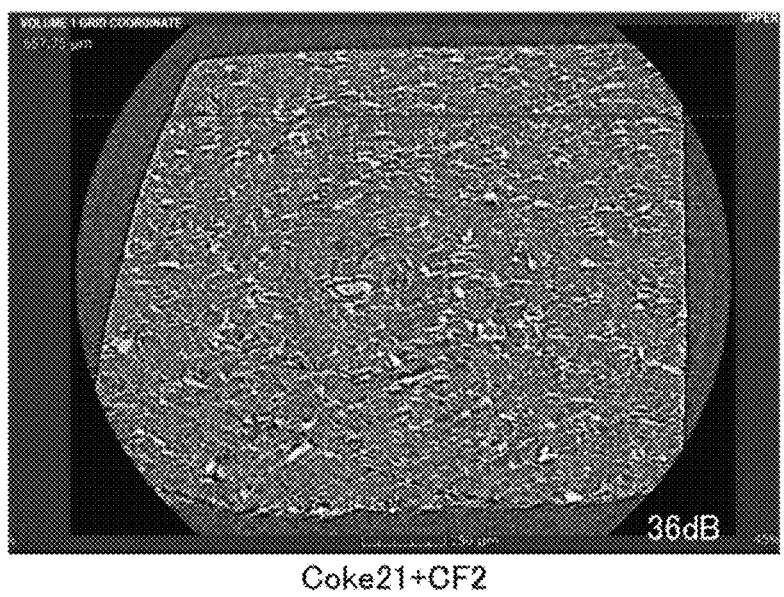
FIG. 6A illustrates an X-ray CT image of the cross-section orthogonal to the injection molding direction and this CT image indicates the internal structure of the electrically conductive resin composition containing 21 wt % of the coke powder and 2 wt % of the carbon fiber of long fiber specification according to one embodiment of the present disclosure.
Figure 6B:
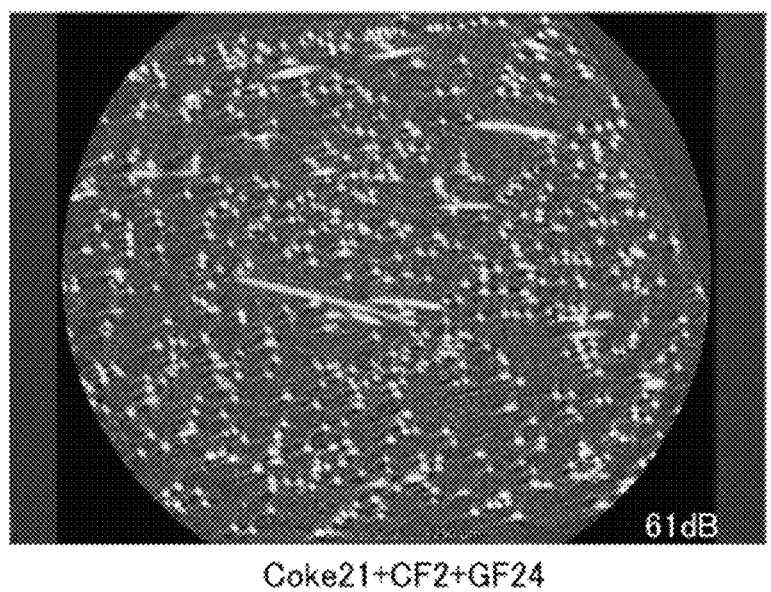
FIG. 6B illustrates an X-ray CT image of the cross-section orthogonal to the injection molding direction and this CT image indicates the internal structure of the electrically conductive resin composition containing 21 wt % of the coke powder, 2 wt % of the carbon fiber of long fiber specification, and 24 wt % of the glass fiber of long fiber specification according to one embodiment of the present disclosure.

The reason may be that the addition of the glass fiber makes a network of the coke powder and the carbon fiber denser as illustrated in FIG. 5B and FIG. 6B. In FIG. 5A and FIG. 6A, the particle material is the coke powder and the linear material is carbon fiber. In FIG. 5B and FIG. 6B, the particle material is the coke powder, the thin linear material extending between particles is the carbon fiber, and the thick and long linear material is the glass fiber.

More specifically, the addition of the glass fiber makes the amount of the solid content (the coke powder, the carbon fiber, and the glass fiber) in the electrically conductive resin composition larger than the amount of the solid content (the coke powder and the carbon fiber) in the electrically conductive resin composition that does not contain the glass fiber. This causes contact (connection) between the coke powders and contact (connection) between the coke powder and the carbon fiber to more easily occur, so that the structure of a network of the coke powder and the carbon fiber becomes denser. At this time, the contact area between the coke powders and the contact area between the coke powder and the carbon fiber also increase. This may cause the formed paths to become longer and thicker and the electric conductivity to be further improved.

For example, commercially available glass fiber such as E glass or S glass may be used as the glass fiber. These types of glass fiber may be used alone or two or more types may be used in combination.

The mean fiber length of the glass fiber is preferably 0.5 mm or more, more preferably 1 mm or more, still more preferably 1.5 mm or more, and yet more preferably 2 mm or more. In addition, the mean fiber length of the glass fiber is preferably 10 mm or less and more preferably 5 mm or less from the viewpoint of improving moldability. Of the glass fiber, the glass fiber of long fiber specification that has a mean fiber length of 1.5 mm or more is preferable from the viewpoint of further improving the mechanical properties and the electric conductivity of the electromagnetic shielding material.

The mean fiber diameter of the glass fiber is preferably 10 μm or more and more preferably 12 μm or more from the viewpoint of improving the mechanical properties of the electromagnetic shielding material. In addition, the mean fiber diameter is preferably 25 μm or less and more preferably 20 μm or less from the viewpoint of improving moldability.

The aspect ratio of the glass fiber is preferably 5 or more, more preferably 50 or more, and still more preferably 100 or more from the viewpoint of improving mechanical properties. In addition, the aspect ratio of the glass fiber is preferably 700 or less, more preferably 250 or less, and still more preferably 150 or less from the viewpoint of improving moldability.

The content percentage of the glass fiber in the electrically conductive resin composition is preferably 10 wt % or more and more preferably 15 wt % or more from the viewpoint of improving the mechanical properties of the electromagnetic shielding material. In addition, the content percentage of the glass fiber is preferably 40 wt % or less, more preferably 30 wt % or less, and still more preferably 25 wt % or less from the viewpoint of improving moldability.

The total of the content percentage of the coke powder, the content percentage of the carbon fiber, and the content percentage of the glass fiber in the electrically conductive resin composition is preferably 15 wt % or more, more preferably 20 wt % or more, still more preferably 25 wt % or more, and yet more preferably 30 wt % or more from the viewpoint of improving the mechanical properties and the electric conductivity of the electromagnetic shielding material. In addition, the total of the content percentage of the coke powder, the content percentage of the carbon fiber, and the content percentage of the glass fiber is preferably 70 wt % or less, more preferably 60 wt % or less, and still more preferably 55 wt % or less from the viewpoint of improving moldability and mechanical properties and reducing the cost of the electromagnetic shielding material.

(Method of Manufacturing Electrically Conductive Resin Composition)

Next, the method of manufacturing an electrically conductive resin composition will be described. The pellet containing, in the matrix resin, individual components such as the coke powder, the carbon fiber, and, if necessary, the glass fiber and other electrically conductive materials is used as a masterbatch. The masterbatch in which the individual components are mixed so as to have a desired formulation ratio is put into a kneading extruder. The kneading extruder is, for example, a twin-screw extruder. An electrically conductive resin composition is obtained by melting and kneading the mixture having been put into this kneading extruder and uniformly dispersing the individual components in the matrix resin.

<Electromagnetic Shielding Material>
(Electromagnetic Shielding Material)

The electromagnetic shielding material according to the embodiment is made of the electrically conductive resin composition. Since this electromagnetic shielding material is made of the electrically conductive resin composition, the electromagnetic shielding material exhibits good electromagnetic shielding performance and good mechanical properties and can be reduced in cost.

The electromagnetic shielding material can be preferably used for cover materials used around (front, side, and rear) a vehicle, such as, for example, a bumper, as well as cover materials for radar-related products. It should be noted here that this electromagnetic shielding material is not limited to members of a vehicle and can also be preferably used for members that need to shield electromagnetic waves, such as, for example, the cabinets of general electronic devices and the bodies of robots.

(Method of Manufacturing Electromagnetic Shielding Material)

The method of manufacturing the electromagnetic shielding material is not particularly limited and the electromagnetic shielding material having a desired shape can be obtained by a generally used hot pressing molding method. For example, in the case of injection molding, the electromagnetic shielding material is manufactured by injecting the fused material (electrically conductive resin composition) molten and kneaded as described above into a metal mold and cooling the fused material. The molding method is not particularly limited and may be, for example, extrusion molding, vacuum molding, compression molding, autoclave molding, resin transfer molding (RTM), or the like in addition to the injection molding described above.

<Effects>

According to the electrically conductive resin composition according to the embodiment, since the carbon fiber is used together with the coke powder as an electrically conductive material, a network of the coke powder and the carbon fiber is formed in the matrix resin and paths through which electricity flows are formed. Accordingly, the electromagnetic shielding material having good electromagnetic shielding performance can be molded. In addition, since a network of the coke powder and the carbon fiber is formed in the matrix resin, the mechanical properties of the electromagnetic shielding material are also improved. Furthermore, since the amount of the coke powder and the carbon fiber is relatively small, the material cost can be reduced and a low-cost electromagnetic shielding material can be obtained.

In addition, by combining the coke powder and the carbon fiber with the glass fiber, the electromagnetic shielding material having further improved electric conductivity and mechanical properties can be obtained.

Example

The present disclosure will be described below based on examples. The present disclosure is not limited to the following examples and the following examples can be modified or changed based on the spirit of the present disclosure, so the modifications and changes should not be excluded from the scope of the present disclosure.

<Manufacturing of Electrically Conductive Resin Composition and Electromagnetic Shielding Material>

As the matrix resin, Polypropylene (PP) manufactured by Prime Polypro (product number J106B) was used. As the coke powder, a finely pulverized product (with a volume mean particle diameter of 25 μm, a plane spacing d002 of 0.350 nm, and a relative intensity ratio α of peak intensities of 25.9 of the pitch coke (product number LPC-U) manufactured by C-Chem was used. Plastron (PP containing 40% carbon fiber) manufactured by Daicel Polymer is used as the carbon fiber, and the long fiber specification (with a mean fiber length of 4 mm, a mean fiber diameter of 7 μm, and an aspect ratio of approximately 570) and the short fiber specification (with a mean fiber length of 0.9 mm, a mean fiber diameter of 7 μm, and an aspect ratio of approximately 130) were manufactured depending on the molding conditions. FUNKSTER (PP containing 40% glass fiber) manufactured by Japan Polypropylene is used as the glass fiber and the long fiber specification (with a mean fiber length of 2 mm, a mean fiber diameter of 18 μm, and an aspect ratio of approximately 110) and the short fiber specification (with a mean fiber length of 1 mm, a mean fiber diameter of 18 μm, and an aspect ratio of approximately 56) were manufactured depending on the molding conditions.

The pellets in which components such as the pitch coke powder, the carbon fiber, and, if necessary, the glass fiber were contained in polypropylene at the content percentages illustrated in Table 1 were prepared as the masterbatch. This masterbatch was put into the kneading extruder and then molten and kneaded. A molten and kneaded fused material (electrically conductive resin composition) was obtained by uniformly dispersing the above components in the matrix resin.

Subsequently, the electrically conductive resin composition obtained above was put into an injection molding apparatus and injected into a one-point direct gate mold (360 mm×250 mm×3 mm) to prepare a test resin plate (electromagnetic shielding material). The thickness of the test resin plate was 3 mm. The molding conditions were as follows: a resin temperature of 240° C., a mold temperature of 60° C., a screw rotation speed of 80 rpm (double flight screws), a back pressure of 10 MPa, an injection speed of 40 mm/s, and a holding pressure of 40 MPa×4 seconds.

<Evaluation of Basic Physical Properties (Mechanical Properties)>

The basic physical properties and the electromagnetic shielding performance of the electromagnetic shielding material were evaluated by the following methods using the test resin plate obtained above. The results are illustrated in Table 1.

(Specific Gravity)

The specific gravity was measured according to method A of JIS K 7112. The testing machine with a part number of ED-120T manufactured by MIRAGE, which is an underwater replacement testing machine, was used as the testing machine. The measurement was performed at a water temperature of 23° C.

(Tensile Yield Stress and Tensile Fracture Strain)

A tensile test was performed according to JIS K 7161 to measure the tensile yield stress and the tensile fracture strain. The precision universal testing machine (Autograph AG-5kNX manufactured by Shimadzu Corporation) was used as the testing machine. It should be noted here that the measurement was performed at a displacement speed of 5 mm/min and an inter-chuck distance of 12.5 cm in the environment with a temperature of 23° C. and a relative humidity of 50 RH %.

(Bending Strength and Bending Elastic Modulus)

A three-point bending test was performed according to JIS K 7171 to measure the bending strength and the bending elastic modulus. The precision universal testing machine (Autograph AG-5kNX manufactured by Shimadzu Corporation) was used as the testing machine. It should be noted here that the measurement was performed at a displacement speed of 2 mm/min in the environment with a temperature of 23° C. and a relative humidity of 50 RH %.

(Charpy Strength)

A Charpy impact test was performed according to JIS K 7111 to measure the Charpy strength. The measurement was performed using the Charpy testing machine manufactured by Toyo Seiki Co., Ltd. as the testing machine, a 1J hammer as the hammer, and a type A notched test piece. The measurement was performed in the environment with a temperature of 23° C. and a relative humidity of 50 RH %.

<Evaluation of Electromagnetic Shielding Performance>

The electric field shielding effect of the test resin plate obtained above was evaluated by the KEC method using the electromagnetic shielding effect measuring device developed by KEC Electronic Industry Development Center. Electromagnetic waves with a frequency of 1.7 MHz were used. The measurement was performed in the atmosphere with a temperature of 25° C. and a relative humidity of 30 to 50%.

TABLE 1

| Electrically conductive resin composition Abbreviation of formulated components | | | 1 GF30 | Examples 2 Coke21 +CF2 +GF24 (L) | 3 Coke30 +CF2 +GF18 (S) | 4 Coke30 +CF2 +GF18 (L) | Comparative examples 1 Coke30 | 2 Coke40 | 3 Coke50 | 4 Coke60 | 5 CF7 | 6 CF7 | 7 CF10 |
|---|---|---|---|---|---|---|---|---|---|---|---|---|---|
| | | | | Coke30 +CF2 | | | | | | | | | | |
| Content of formulated components (wt %) | Coke (MV: 25 μm) | | 0 | 30 | 21 | 30 | 30 | 30 | 40 | 50 | 60 | 0 | 0 | 0 |
| | CF | Long fiber (4 mm) | 0 | 2 | 2 | 0 | 2 | 0 | 0 | 0 | 0 | 3 | 7 | 10 |
| | | Short fiber (0.9 mm) | 0 | 0 | 0 | 2 | 0 | 0 | 0 | 0 | 0 | 0 | 0 | 0 |
| | GF | Long fiber (2 mm) | 30 | 0 | 24 | 0 | 18 | 0 | 0 | 0 | 0 | 0 | 0 | 0 |
| | | Short fiber (1 mm) | 0 | 0 | 0 | 18 | 0 | 0 | 0 | 0 | 0 | 0 | 0 | 0 |
| | Matrix resin (PP) | | 70 | 68 | 53 | 50 | 50 | 70 | 60 | 50 | 40 | 97 | 93 | 90 |
| Content of Coke + CF (wt %) | | | 0 | 32 | 23 | 32 | 32 | 30 | 40 | 50 | 60 | 3 | 7 | 10 |
| Content of Coke + CF + GF (wt %) | | | 30 | 32 | 47 | 50 | 50 | 30 | 40 | 50 | 60 | 3 | 7 | 10 |
| Mechanical properties | Specific gravity | | 1.12 | 1.11 | 1.25 | 1.28 | 1.28 | 1.09 | 1.17 | 1.25 | 1.32 | 0.92 | 0.94 | 0.95 |
| | Tensile yield stress (MPa) | | 93 | 43 | 97 | 63 | 87 | 29 | 31 | 31 | 31 | 43 | 54 | 60 |
| | Tensile fracture strain (%) | | 3.0 | 2.5 | 2.9 | 2.7 | 2.8 | 4.0 | 2.6 | 1.9 | 1.5 | 4.8 | 3.5 | 2.7 |
| | Tensile elastic modulus (MPa) | | — | 4280 | 7080 | 6600 | 7290 | 2540 | 2970 | 3090 | 3150 | 2270 | 3590 | 4870 |
| | Bending strength (MPa) | | 138 | 67 | 142 | 89 | 133 | 49 | 49 | 48 | 48 | 59 | 74 | 92 |
| | Bending elastic modulus (MPa) | | 6200 | 4930 | 8360 | 6560 | 8720 | 3170 | 4100 | 5060 | 5910 | 2420 | 3590 | 4870 |
| | Charpy strength (KJ/m$^2$) | | 18 | 6 | 19 | 8 | 17 | 1 | 1 | 2 | 2 | 6 | 12 | 16 |

TABLE 1-continued

| Electrically conductive resin composition Abbreviation of formulated components | | GF30 | Examples | | | | Comparative examples | | | | | | |
|---|---|---|---|---|---|---|---|---|---|---|---|---|---|
| | | | 1 Coke30 +CF2 | 2 Coke21 +CF2 +GF24 (L) | 3 Coke30 +CF2 +GF18 (S) | 4 Coke30 +CF2 +GF18 (L) | 1 Coke30 | 2 Coke40 | 3 Coke50 | 4 Coke60 | 5 CF7 | 6 CF7 | 7 CF10 |
| Electric properties | 1.7 MHz electric field shielding performance (dB) | — | 52 | 61 | 51 | 65 | 2 | 12 | 39 | 60 | 31 | 47 | 56 |

<Others>

Figure 7:
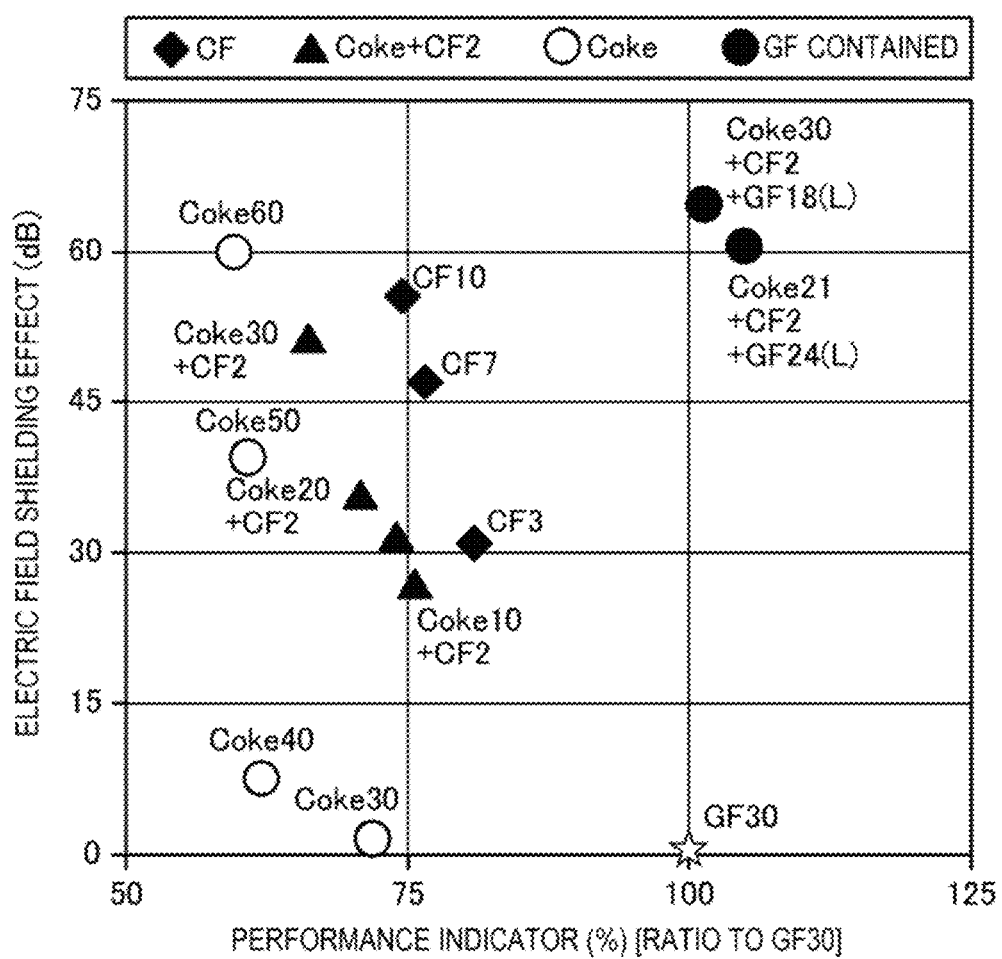
FIG. 7 illustrates the electromagnetic shielding performance with respect to the performance indicator of the electrically conductive resin compositions according to one embodiment of the present disclosure.

FIG. 7 illustrates the electromagnetic shielding performance with respect to the performance indicator of the electrically conductive resin compositions. It should be noted here that the performance indicator refers to the index representing the performance of the mechanical properties when that of GF30 is assumed to be 100%. This performance indicator is calculated by the following equation.

Performance indicator=[($TM/TMGF30$)+($TS/TSGF30$)+($TE/TEGF30$)]/3×100 (Equation)

In the above equation, TM, TS, and TE represent the tensile elastic modulus, the tensile yield stress, and the tensile fracture strain of each of the test resin plates, respectively. In addition, TMGF30, TSGF30, and TEGF30 represent the tensile elastic modulus, the tensile yield stress, and tensile fracture strain of GF30, respectively.

Figure 8:
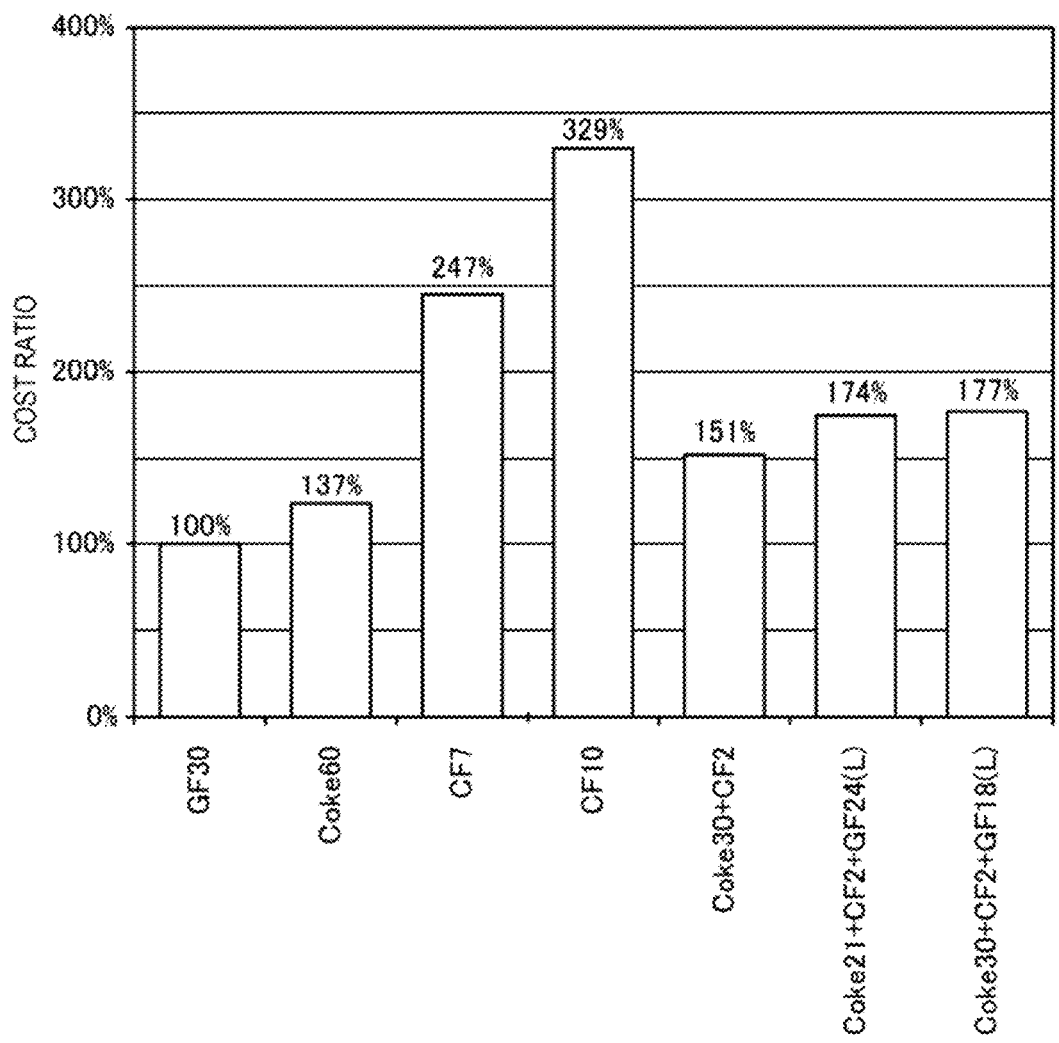
FIG. 8 illustrates the cost ratio of the electrically conductive resin compositions according to one embodiment of the present disclosure.

In addition, the cost ratios of the electrically conductive resin compositions are illustrated in FIG. 8. The cost ratios were evaluated by assuming the material cost of GF30 to be 100%.

<Summary>

It can be seen from the results illustrated in FIG. 7 that the (total) content percentage of the electrically conductive material in the electrically conductive resin composition of example 1 (Coke30+CF2) is lower than in comparative example 3 (Coke50) and comparative example 4 (coke60), which have equally good electromagnetic shielding performance, so example 1 has better mechanical properties.

It can be seen from the results illustrated in FIG. 8, the content percentage of the carbon fiber in the electrically conductive resin composition of example 1 (Coke30+CF2) is lower (one thirds or less) than in comparative example 7 (CF10), which has equally good electromagnetic shielding performance, so the cost ratio is reduced to the half or less.

Accordingly, since the electrically conductive resin composition of example 1 contains the coke powder and the carbon fiber as electrically conductive materials at predetermined content percentages, an electromagnetic shielding material having good electromagnetic shielding performance can be molded. In addition, the electromagnetic shielding material with good mechanical properties can be molded since a network of the coke powder and the carbon fiber is formed in the matrix resin in the electrically conductive resin composition of example 1. Furthermore, the cost-reduced electromagnetic shielding material can be molded since the amount of the coke powder and carbon fiber contained in the electrically conductive resin composition of example 1 is relatively small.

In addition, it can be seen from the results illustrated in FIG. 7 that example 4 (Coke30+CF2+GF18 (L)) contains more glass fiber than example 1 (Coke30+CF2), so example 4 has better mechanical properties and the electromagnetic shielding performance thereof is dramatically improved.

It can be seen from the results illustrated in FIG. 8 that example 4 (Coke30+CF2+GF18(L)) has almost the same cost ratio as example 1 (Coke30+CF2). It should be noted here that, as example 4, examples 2 and 3 (see Table 1) containing the glass fiber also have almost the same cost ratios as example 1.

Accordingly, since the electrically conductive resin compositions of examples 2 to 4 contain the coke powder, the carbon fiber, and the glass fiber at predetermined content percentages, the electrically conductive resin compositions have even better mechanical properties and electromagnetic shielding performance and cost-reduced electromagnetic shielding materials can be molded.

INDUSTRIAL APPLICABILITY

As described above, the electrically conductive resin composition related to the present disclosure is useful as a material for molding an electromagnetic shielding material and the like.

The invention claimed is:

1. An electrically conductive resin composition comprising matrix resin, coke powder, and carbon fiber,
    wherein a volume mean particle diameter of the coke powder is not less than 1 µm and not more than 500 µm,
    a content percentage of the coke powder in the electrically conductive resin composition is not less than 1 wt % and no more than 60 wt %,
    an aspect ratio of the carbon fiber is not less than 3 and not more than 1700,
    a content percentage of the carbon fiber in the electrically conductive resin composition is not less than 0.5 wt % and not more than 10 wt %, and
    the matrix resin is a thermoplastic resin.

2. The electrically conductive resin composition according to claim 1,
    wherein the coke powder is pitch coke powder.

3. The electrically conductive resin composition according to claim 2,
    wherein the volume mean particle diameter of the coke powder is not less than 10 µm and not more than 50 µm.

4. The electrically conductive resin composition according to claim 3,
    wherein a mean fiber diameter of the carbon fiber is not less than 3 µm and not more than µm, and a mean fiber length of the carbon fiber is not less than 0.5 mm and not more than 25 mm.

5. The electrically conductive resin composition according to claim 4,
wherein a total of the content percentage of the coke powder and the content percentage of the carbon fiber in the electrically conductive resin composition is not less than 5 wt % and not more than 70 wt %.

6. The electrically conductive resin composition according to claim 5,
wherein the total of the content percentage of the coke powder and the content percentage of the carbon fiber in the electrically conductive resin composition is not less than 5 wt % and not more than 40 wt %.

7. The electrically conductive resin composition according to claim 6, further comprising:
glass fiber,
wherein a content percentage of the glass fiber in the electrically conductive resin composition is not less than 10 wt % and not more than 40 wt %.

8. The electrically conductive resin composition according to claim 7,
wherein a total of the content percentage of the coke powder, the content percentage of the carbon fiber, and the content percentage of the glass fiber in the electrically conductive resin composition is not less than 15 wt % and not more than 70 wt %.

9. The electrically conductive resin composition according to claim 3,
wherein a mean fiber diameter of the carbon fiber is not less than 6 µm and not more than 10 µm, and
a mean fiber length of the carbon fiber is not less than 3 mm and not more than 10 mm.

10. An electromagnetic shielding material comprising:
the electrically conductive resin composition according to claim 1.

11. A member, comprising the electromagnetic shielding material according to claim 10.

12. The member of claim 11, wherein the electromagnetic shielding material having a shape is obtained by a hot pressing molding method.

13. The member of claim 11, wherein the electromagnetic shielding material is obtained by injection molding.

14. The electrically conductive resin composition according to claim 1,
wherein the volume mean particle diameter of the coke powder is not less than 10 µm and not more than 50 µm.

15. The electrically conductive resin composition according to claim 1,
wherein a mean fiber diameter of the carbon fiber is not less than 3 µm and not more than 12 µm, and
a mean fiber length of the carbon fiber is not less than 0.5 mm and not more than 25 mm.

16. The electrically conductive resin composition according to claim 1,
wherein a mean fiber diameter of the carbon fiber is not less than 6 µm and not more than 10 µm, and
a mean fiber length of the carbon fiber is not less than 3 mm and not more than 10 mm.

17. The electrically conductive resin composition according to claim 1,
wherein a total of the content percentage of the coke powder and the content percentage of the carbon fiber in the electrically conductive resin composition is not less than 5 wt % and not more than 70 wt %.

18. The electrically conductive resin composition according to claim 1, further comprising:
glass fiber,
wherein a content percentage of the glass fiber in the electrically conductive resin composition is not less than 10 wt % and not more than 40 wt %.

19. The electrically conductive resin composition according to claim 1,
wherein the matrix resin is polypropylene.

20. A cover material for a vehicle, comprising an electromagnetic shielding material, which comprises an electrically conductive resin composition comprising matrix resin, coke powder, and carbon fiber,
wherein a volume mean particle diameter of the coke powder is not less than 1 µm and not more than 500 µm,
a content percentage of the coke powder in the electrically conductive resin composition is not less than 1 wt % and no more than 60 wt %,
an aspect ratio of the carbon fiber is not less than 3 and not more than 1700,
a content percentage of the carbon fiber in the electrically conductive resin composition is not less than 0.5 wt % and not more than 10 wt %, and
the matrix resin is a thermoplastic resin.

* * * * *